United States Patent
Fu et al.

(10) Patent No.: US 11,336,040 B2
(45) Date of Patent: May 17, 2022

(54) CONDUCTIVE TERMINAL WITH CLAMPING PORTION AND CONNECTOR ASSEMBLY USING THE SAME

(71) Applicant: Tyco Electronics (Shanghai) Co. Ltd., Shanghai (CN)

(72) Inventors: Xiaozhi Fu, Shanghai (CN); Ming Shi, Shanghai (CN); Hongtao Jiang, Shanghai (CN); Wei Zhang, Shanghai (CN); Dingbing Fan, Shanghai (CN); Shuzhi Wang, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 16/694,259

(22) Filed: Nov. 25, 2019

(65) Prior Publication Data
US 2020/0176902 A1    Jun. 4, 2020

(30) Foreign Application Priority Data
Nov. 29, 2018  (CN) .......................... 201821992019.9

(51) Int. Cl.
*H01R 12/57* (2011.01)
*H05K 1/18* (2006.01)
(Continued)

(52) U.S. Cl.
CPC ............. *H01R 12/57* (2013.01); *H05K 1/181* (2013.01); *H01R 4/4818* (2013.01); *H01R 12/53* (2013.01);
(Continued)

(58) Field of Classification Search
CPC .... H01R 12/716; H01R 43/16; H01R 12/718; H01R 12/57; H01R 12/707; H01R 12/515; H01R 12/7082; H01R 4/4818; H01R 13/187; H01R 43/0256; H01R 13/11; H01R 13/02; H01R 4/2416; H01R 43/02; H01R 12/53; H01R 4/4845; H01R 12/7011; H01R 2101/00; H01R 33/465; H01R 33/9456;
(Continued)

(56) References Cited

U.S. PATENT DOCUMENTS

4,396,242 A * 8/1983 Kurano .................. H01R 24/50
                                                       439/581
5,131,853 A * 7/1992 Meyer .................... H01R 4/028
                                                       439/82
(Continued)

*Primary Examiner* — Abdullah A Riyami
*Assistant Examiner* — Justin M Kratt
(74) *Attorney, Agent, or Firm* — Barley Snyder (57) ABSTRACT

A conductive terminal electrically connects a conductor of a conductive wire to a circuit board. The conductive terminal includes a body, a clamping portion having a pair of clamping arms, and a solder portion having a pair of solder lugs. The body has an opening through which the conductive wire is inserted and a passage communicating with the opening, the passage receiving the conductive wire and extending perpendicular to a surface of the circuit board. The pair of clamping arms extend from the opening towards the circuit board and obliquely towards each other so as to clamp the conductor of the conductive wire inserted through the opening. The solder portion has a pair of solder lugs extending perpendicular to a lengthwise direction of the passage and soldered to a pair of solder pads on the circuit board.

20 Claims, 8 Drawing Sheets

(51) Int. Cl.
   *H01R 4/48*       (2006.01)
   *H05K 3/34*       (2006.01)
   *H01R 101/00*    (2006.01)
   *H01R 12/53*     (2011.01)
   *H01R 13/58*     (2006.01)

(52) U.S. Cl.
   CPC .......... *H01R 13/58* (2013.01); *H01R 2101/00* (2013.01); *H05K 1/184* (2013.01); *H05K 3/3421* (2013.01); *H05K 2201/10295* (2013.01); *H05K 2201/10333* (2013.01)

(58) Field of Classification Search
   CPC .......... H01R 4/24; H01R 12/71; H01R 13/58; H05K 1/181; H05K 2201/10295
   USPC ............................................ 439/82, 437–439
   See application file for complete search history.

(56) References Cited

U.S. PATENT DOCUMENTS

| | | | | |
|---|---|---|---|---|
| 5,494,456 A | * | 2/1996 | Kozel ................ | H01R 4/4827 |
| | | | | 439/439 |
| 2019/0020129 A1 | * | 1/2019 | Jin ...................... | H01R 4/4818 |

* cited by examiner

CONDUCTIVE TERMINAL WITH CLAMPING PORTION AND CONNECTOR ASSEMBLY USING THE SAME

CROSS-REFERENCE TO RELATED APPLICATION

This application claims the benefit of the filing date under 35 U.S.C. § 119(a)-(d) of Chinese Patent Application No. 201821992019.9, filed on Nov. 29, 2018.

FIELD OF THE INVENTION

The present invention relates to a conductive terminal and, more particularly, to a conductive terminal connecting a conductor to a circuit board.

BACKGROUND

Electrical connectors are generally used to electrically connect conductive wires to a circuit board. When a conductive terminal in the electrical connector is electrically connected with the circuit board, the conductive terminal is usually fixed in an insulating housing in advance, and then is fixedly connected with the circuit board. However, such a connection method is not only costly, but also the insulating housing occupies a large space on the circuit board.

To overcome the above-mentioned drawbacks, conductive terminals have been developed that electrically connect the conductive wire to the circuit board without being fixed in the insulating housing. However, when such a conductive terminal is applied to an electrical product (e.g., a LED lamp) in a vertical mounting manner, a portion of the structure of the conductive terminal usually protrudes from a surface of the circuit board on which a light source is mounted, thereby affecting lighting effects. In addition, in the current conductive terminal without any housing, capabilities for positioning and holding the conductive wire inserted therein are lower, and thus the conductive wire is easily disconnected.

SUMMARY

A conductive terminal electrically connects a conductor of a conductive wire to a circuit board. The conductive terminal includes a body, a clamping portion having a pair of clamping arms, and a solder portion having a pair of solder lugs. The body has an opening through which the conductive wire is inserted and a passage communicating with the opening, the passage receiving the conductive wire and extending perpendicular to a surface of the circuit board. The pair of clamping arms extend from the opening towards the circuit board and obliquely towards each other so as to clamp the conductor of the conductive wire inserted through the opening. The solder portion has a pair of solder lugs extending perpendicular to a lengthwise direction of the passage and soldered to a pair of solder pads on the circuit board.

BRIEF DESCRIPTION OF THE DRAWINGS

The invention will now be described by way of example with reference to the accompanying Figures, of which.

DETAILED DESCRIPTION OF THE EMBODIMENT(S)

Technical solutions of the present disclosure will be described hereinafter in further detail with reference to the following embodiments, taken in conjunction with the accompanying drawings. In the description, the same or similar reference numerals indicate the same or similar parts. The description of the embodiments of the present disclosure made hereinafter with reference to the accompanying drawings is intended to explain the general concept of the present disclosure, and should not be constructed as a limitation to the present disclosure.

In addition, in the following detailed description, for the sake of explanation, numerous specific details are set forth in order to provide a thorough understanding of the disclosed embodiments. It will be apparent that, however, one or more embodiments may also be practiced without these specific details. In other instances, well-known structures and devices are illustrated schematically in order to simplify the drawing.

A connector assembly 1, 11 according to various embodiments, as shown in FIGS. 1-4, comprises a conductive terminal 100 and a circuit board 300. In an embodiment, the conductive terminal 100 is formed from a single conductive sheet, such as a copper sheet, by processes such as shearing, stamping, and bending processes. The conductive terminal 100 is adapted to electrically connect a conductor 210 of a conductive wire 200, shown in FIGS. 5-8, to the circuit board 300.

The conductive terminal 100, as shown in FIGS. 1-4, includes a body 110, a clamping portion 120, and a solder portion 130. The body 110 includes a first sidewall 111 and a second sidewall 112 opposite to each other, a third sidewall 114 and a fourth sidewall 115 opposite to each other, and a bottom wall 116. The first sidewall 111 and the second sidewall 112 extend from two opposite sides of the third sidewall 114 respectively in a direction perpendicular to a plane where the third sidewall 114 is located, and the fourth sidewall 115 has a pair of portions extending towards each other from a side of the second sidewall 112 away from the third sidewall 114 and a side of the first sidewall 111 away from the third sidewall 114.

The body 110, as shown in FIGS. 1-4, has an opening 117 through which the conductive wire 200 is to be inserted and a passage 118 for receiving the conductive wire 200. The opening 117 is formed or defined by upper portions of the four sidewalls 111, 112, 114, 115, the passage 118 is a cavity enclosed by the four sidewalls 111, 112, 114, 115 and communicates with the opening 117, and a lengthwise, longitudinal or axial direction of the passage 118 is substantially perpendicular to a surface (that is, a major surface) of the circuit board 300; the passage 118 extends in a direction substantially perpendicular to the surface of the circuit board 300.

In various embodiments, as shown in FIGS. 1-4, the bottom wall 116 is formed by extending ends of the third sidewall 114 and fourth sidewall 115 away from the opening 117 toward each other, or by extending the end of the third sidewall 114 away from the opening 117 toward the end of the fourth sidewall 115 away from the opening 117, or by extending the end of the fourth sidewall 115 toward the end of the third sidewall 114. When a conductor 210 of the conductive wire 200 is inserted into the conductive terminal 100 in an insertion direction, a top-to-bottom direction in FIG. 1 or a bottom-to-top direction in FIG. 3, the bottom wall 116 may block further movement of the conductor 210 in the insertion direction.

As shown in FIGS. 1-4, the clamping portion 120 includes a pair of clamping arms 121, which extend from the opening 117 toward the circuit board 300 obliquely towards each other to clamp the conductor 210 of the conductive wire 200 inserted from the opening 117. The pair of clamping arms 121 extend from the first sidewall 111 and second sidewall 112, respectively. The body 110 has a pair of transition portions 113, which may be formed by extending and bending inward first ends, upper ends shown in FIGS. 1, 2, 5, 6, or lower ends shown in FIGS. 3, 4, 7, 8, of the first sidewall 111 and second sidewall 112 near the opening 117. The pair of clamping arms 121 extend from ends of the cantilevers 113 away from the first ends of the first sidewall 111 and the second sidewall 112 in such a way that the pair of clamping arms 121 extend obliquely towards each other and toward second ends of the first sidewall 111 and the second sidewall 112 opposite to the first ends. In an embodiment, the clamping portion 120 has at least one pair of clamping arms 121, and may have two pairs of clamping arms 121. In an embodiment, free ends of the clamping arms 121 have wire-penetrating portions adapted to clamp the conductive wire 200 and penetrate through an insulating sheath of the conductive wire 200 so as to be electrically connected with the conductor 210 of the conductive wire 200, thereby preventing the conductor 210 from being pulled out of the inserted state. In this way, the conductor 210 of the conductive wire 200 may be reliably held in the conductive terminal 100.

Figure 1:
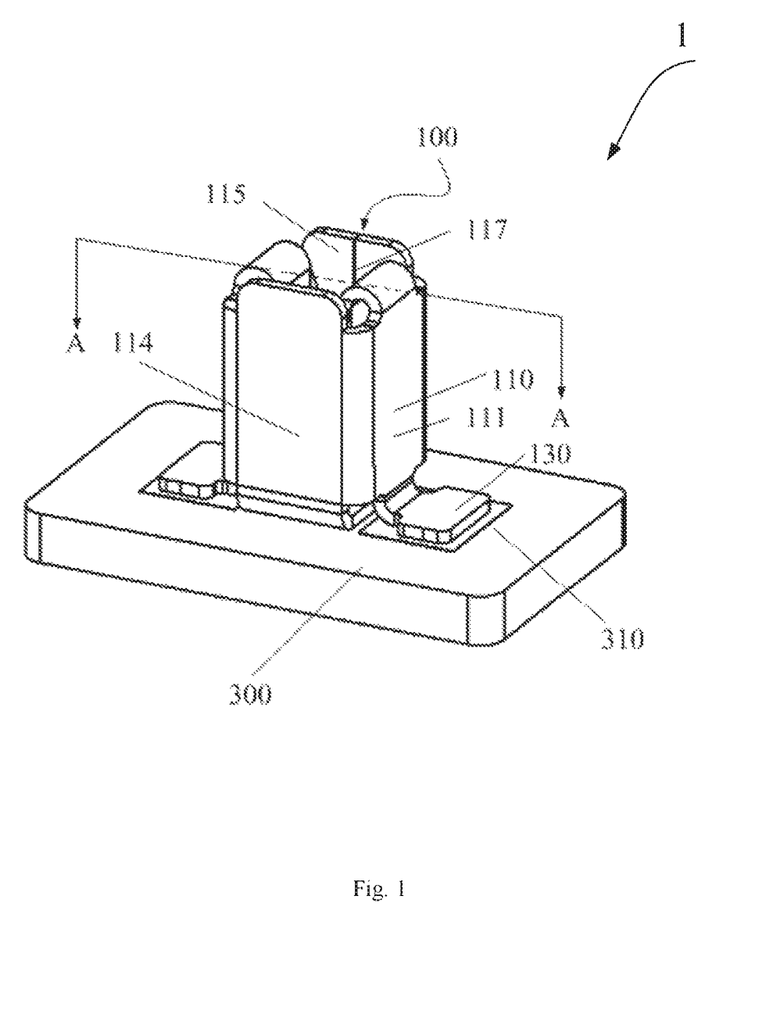
FIG. 1 is a perspective view of a connector assembly according to an embodiment.
Figure 2:
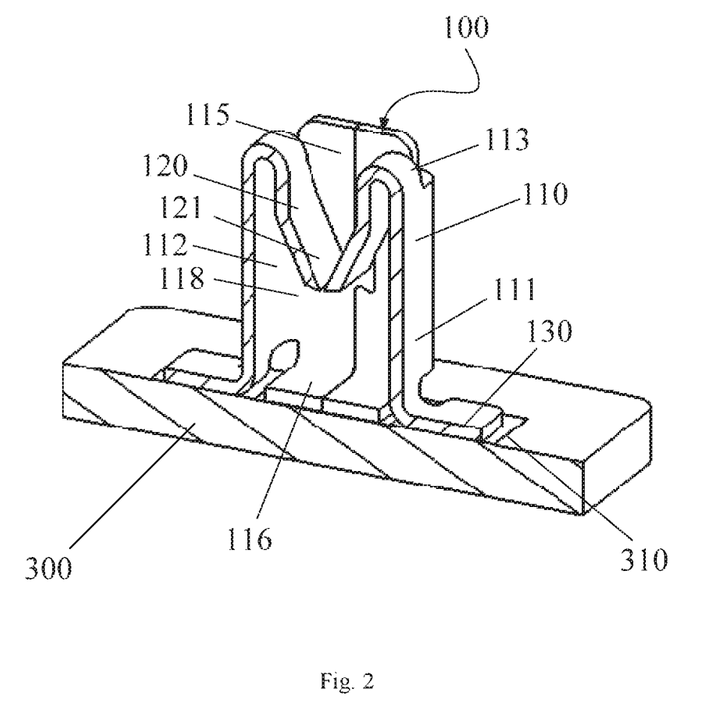
FIG. 2 is a sectional perspective view of the connector assembly, taken along line A-A of FIG. 1.
Figure 3:
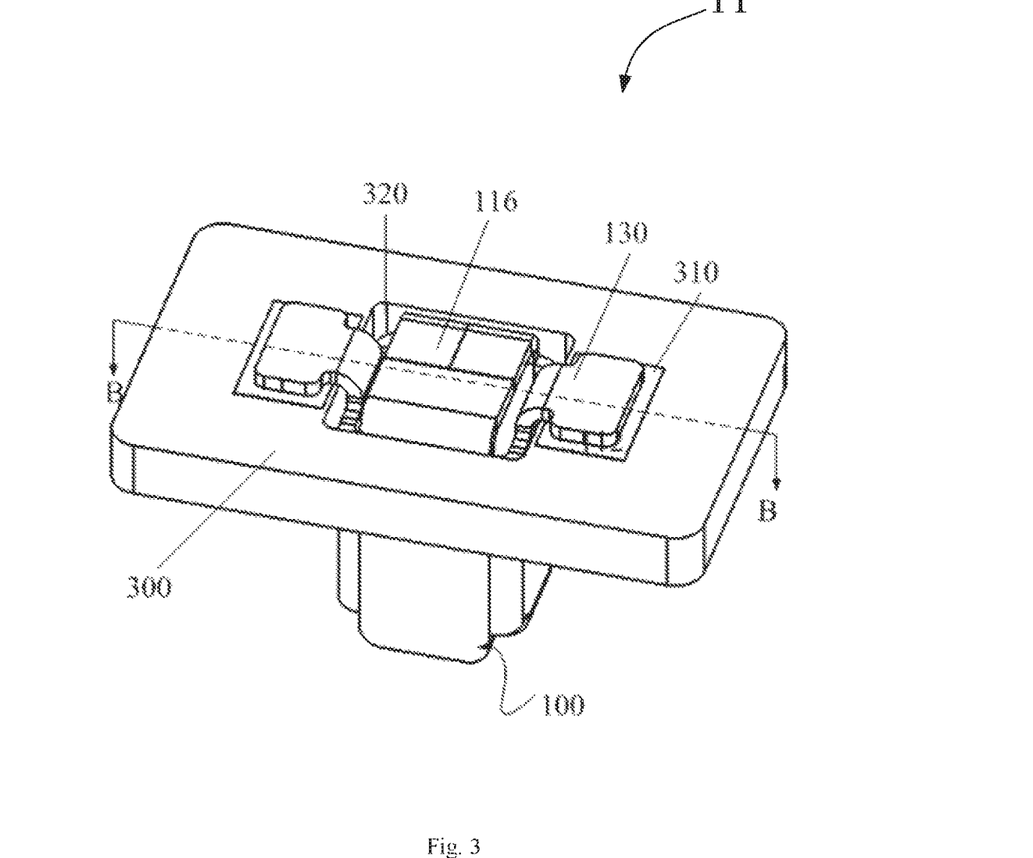
FIG. 3 is a perspective view of a connector assembly according to another embodiment.
Figure 4:
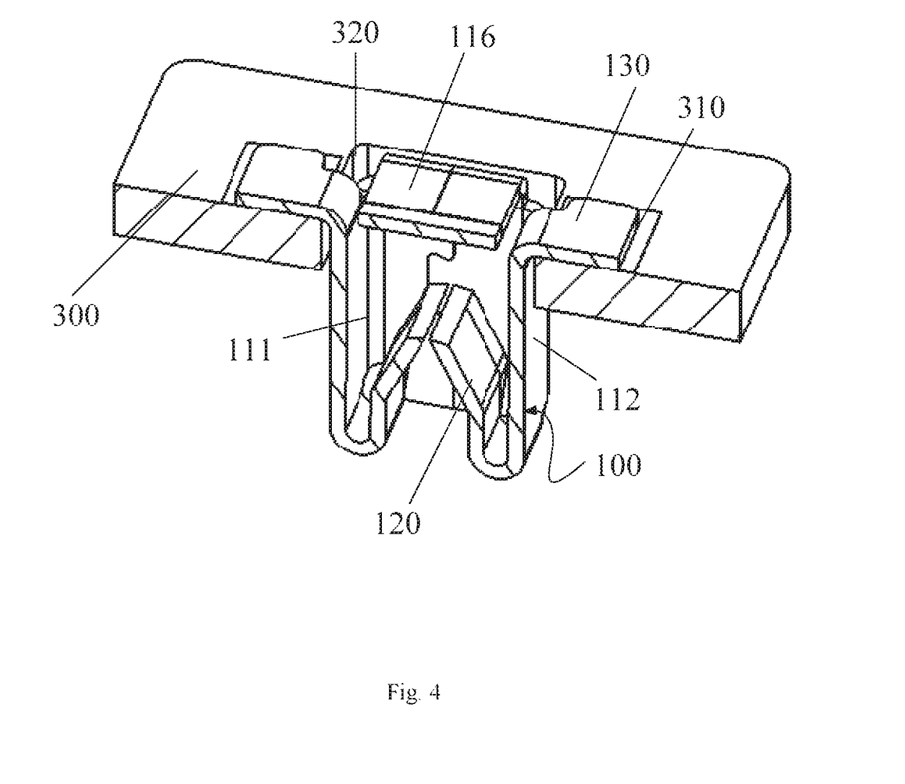
FIG. 4 is a sectional perspective view of the connector assembly, taken along line B-B of FIG. 3.

As shown in FIGS. 1-4, the solder portion 130 has a pair of solder lugs that extend in a direction substantially perpendicular to the lengthwise, longitudinal or axial direction of the passage 118. In an embodiment, the pair of solder lugs extend away from each other from the second ends of the first sidewall 111 and second sidewall 112, respectively, in a direction substantially perpendicular to the plane where the first and second sidewalls 111 and 112 are located, for example, in a direction substantially parallel to the surface of the circuit board 300 or to a plane where the surface of the circuit board 300 is located. In an embodiment, the solder lug has a flat surface adapted to be soldered to a solder pad 310 of the circuit board 300 at a front side or surface, a side or surface facing away from the opening 117, as shown in FIGS. 1 and 2, or a back side or surface, a side or surface facing towards the opening, as shown in FIGS. 3 and 4, of the solder lug by a surface mount technology (SMT). In an embodiment, the solder portion 130 includes at least one pair of solder lugs, for example, two pairs of solder lugs.

Figure 5:
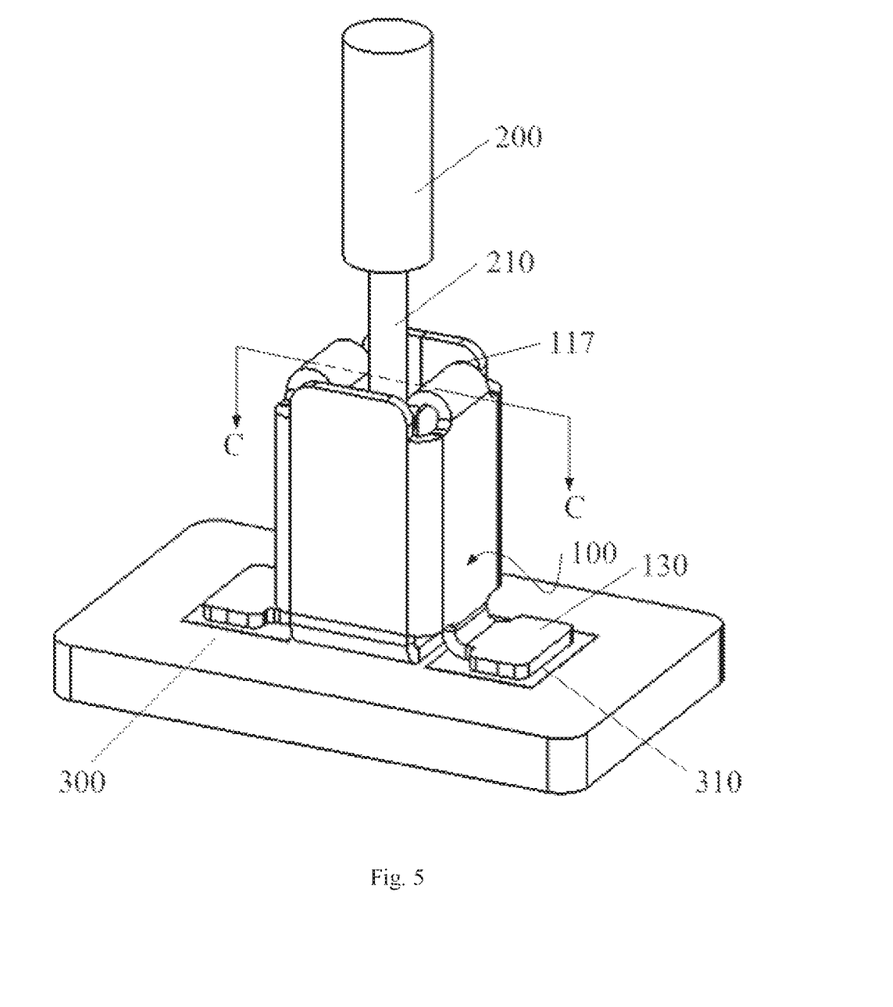
FIG. 5 is a perspective view of a conductive wire inserted into the connector assembly of FIG. 1.
Figure 6:
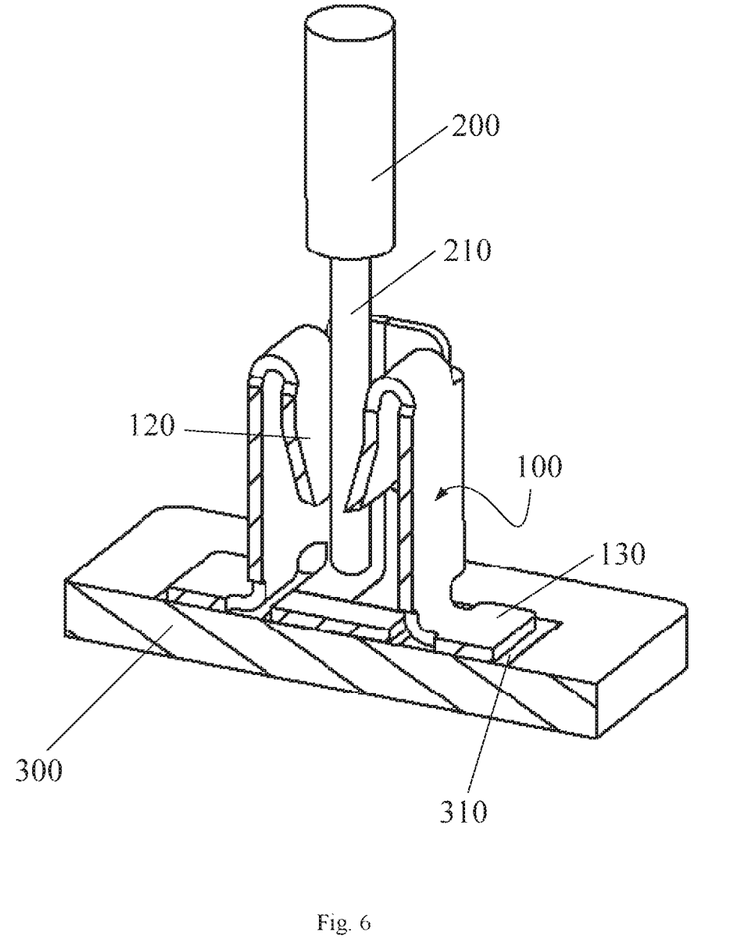
FIG. 6 is a sectional perspective view of the conductive wire in the connector assembly, taken along line C-C of FIG. 5.

As shown in FIGS. 1-2 and 5-6, by using a nozzle of a vacuum adsorption apparatus to suck onto the solder portion 130 of the conductive terminal 100, the conductive terminal 100 is attached onto the solder pad 310 of the circuit board 300 in a forward fixing state; in a manner that the opening 117 of the conductive terminal is located above the passage 118 as shown in FIG. 5. The conductive wire 200 is inserted into the conductive terminal 100 through the opening 117 in the insertion direction, in the top-to-bottom direction as shown in FIG. 5, and is clamped and penetrated by the clamping arms 121. The conductive wire 200 is thereby reliably held in the conductive terminal 100. Further, the conductive terminal 100 and the conductive wire 200 are both located at a same side of the circuit board 300 and do not protrude from the opposite side of the circuit board 300.

Figure 7:
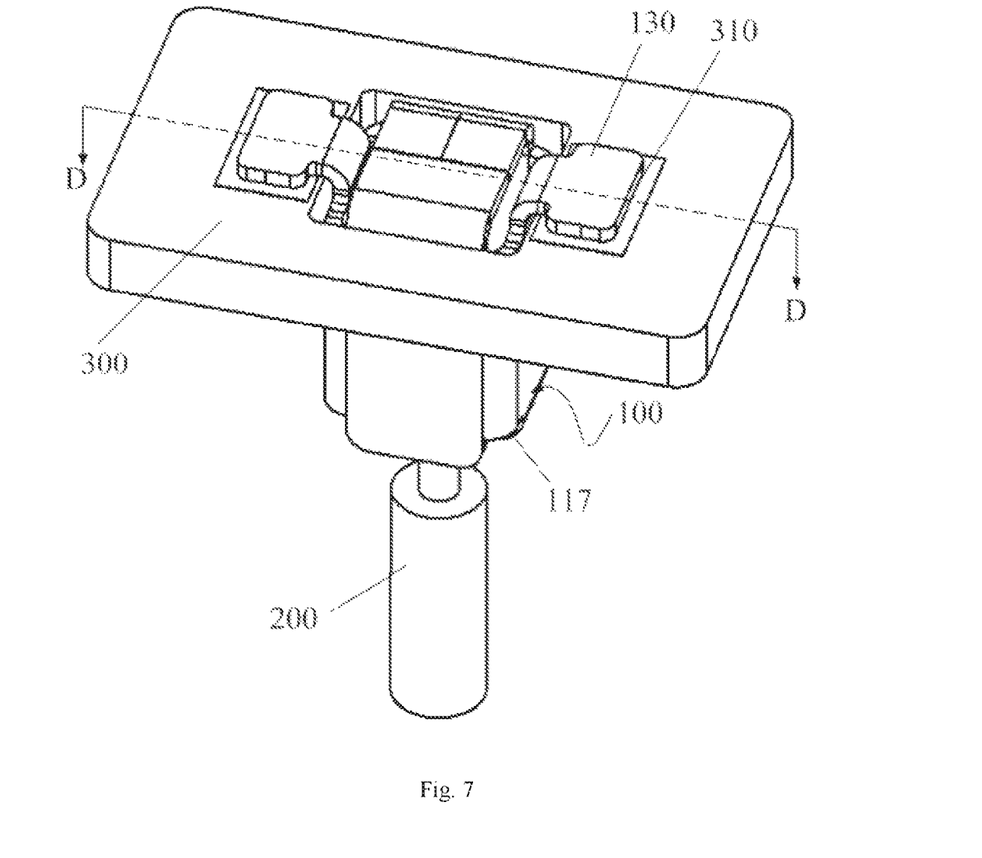
FIG. 7 is a perspective view of a conductive wire inserted into the connector assembly of FIG. 3.
Figure 8:
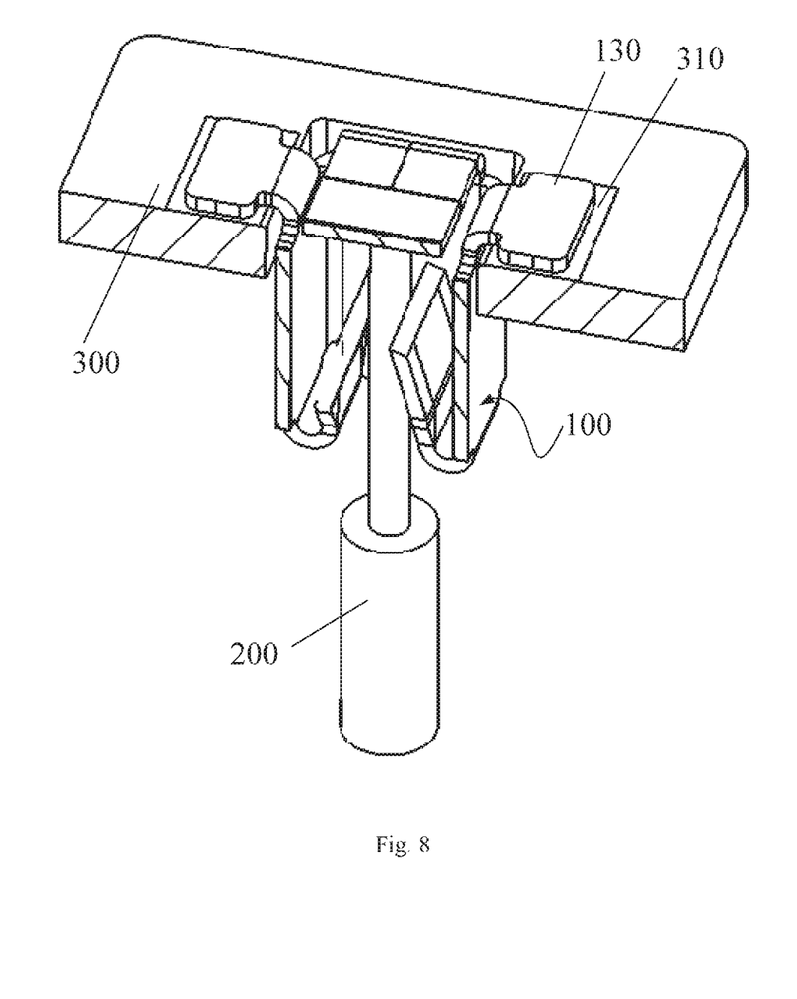
FIG. 8 is a sectional perspective view of the conductive wire in the connector assembly, taken along line D-D of FIG. 7.

As shown in FIGS. 3-4 and 7-8, the circuit board 300 comprises a through hole 320; by using a nozzle of a vacuum adsorption apparatus to suck onto the solder portion 130 of the conductive terminal 100, the body 110 of the conductive terminal 100 passes through the through hole 320 of the circuit board 300, such that the conductive terminal 100 is attached onto the solder pad 310 of the circuit board 300 in an inverse fixing state or in an ITB (inverse through board) fixing state; in such a manner that the opening 117 of the conductive terminal is located below the passage 118, as shown in FIG. 7. The conductive wire 200 is inserted into the conductive terminal 100 through the opening 117 in the insertion direction, in the bottom-to-top direction in FIG. 7, and is clamped and penetrated by the clamping arms 121. The conductive wire 200 is reliably held in the conductive terminal 100. Further, a majority of the structure of the conductive terminal 100 and the conductive wire 200 are located on a same side of the circuit board 300 and do not protrude from the opposite side of the circuit board 300.

With the connector assembly 1, 11, when a LED light source is mounted on the opposite side of the circuit board 300, for example, a lower side shown in FIGS. 1, 2, 5 and 6, or an upper side shown in FIGS. 3, 4, 7 and 8, the conductive terminal 100 and the conductive wire 200 almost have no influence on the illumination from the light source because the conductive terminal 100 and the conductive wire 200 do not protrude from the opposite side of the circuit board 300, thereby meeting the requirement of reducing, as much as possible, the influence of the installation structure of the conductive wires 200 on the illumination of the light source.

It should be appreciated by those skilled in the art that the above embodiments are intended to be illustrative, modifications may be made to the above embodiments by those skilled in the art, and structures described in various embodiments may be freely combined without having structural and principle conflict, so that more conductive terminals and connector assemblies may be implemented based on solving the technical problem of the present disclosure.

Based on detail description of the embodiments of the present disclosure, it will be appreciated by those skilled in the art that modifications may be made to these embodiments without departing from the principle and spirit of the present disclosure, and the present disclosure is not limited thereto.

What is claimed is:

1. A conductive terminal electrically connecting a conductor of a conductive wire to a circuit board, comprising:
   a body having:
      a first sidewall, a second sidewall opposite the first sidewall, a third sidewall and a fourth sidewall opposite the third sidewall and defining an opening through which the conductive wire is inserted and a passage communicating with the opening, the passage receiving the conductive wire and extending perpendicular to a surface of the circuit board; and a bottom wall formed by extending a free end of one of the third sidewall and the fourth sidewall away from the opening towards a free end of the other of the third sidewall and the fourth sidewall away from the opening, or by extending a pair of free ends of the third sidewall and the fourth sidewall away from the opening towards each other;

a clamping portion having a pair of clamping arms, the pair of clamping arms extending from the first sidewall and the second sidewall into the opening towards the circuit board and obliquely towards each other so as to clamp the conductor of the conductive wire inserted through the opening; and a solder portion having a pair of solder lugs, the pair of solder lugs extending perpendicular to a lengthwise direction of the passage and soldered to a pair of solder pads on the circuit board.

2. The conductive terminal of claim 1, wherein the body has a pair of transition portions, the transition portions are disposed at a pair of first ends of the first sidewall and the second sidewall close to the opening and are bent inwardly.

3. The conductive terminal of claim 2, wherein the clamping arms extend from the transition portions toward the circuit board.

4. The conductive terminal of claim 2, wherein the solder lugs extend away from each other from a pair of second ends of the first sidewall and the second sidewall opposite the first ends, the solder lugs extend perpendicular to the first sidewall and the second sidewall.

5. The conductive terminal of claim 4, wherein the first sidewall and the second sidewall are formed by bending a pair of opposite sides of the third sidewall in a direction perpendicular to the third sidewall.

6. The conductive terminal of claim 5, wherein the fourth wall is formed by extending a free end of a side of the second sidewall away from the third sidewall and a free end of a side of the first sidewall away from the third sidewall towards each other.

7. The conductive terminal of claim 1, wherein the bottom wall blocks a movement in an insertion direction of the conductor of the conductive wire when the conductor is inserted into the conductive terminal in the insertion direction.

8. The conductive terminal of claim 1, wherein each of the solder lugs has a flat surface.

9. The conductive terminal of claim 1, wherein an end of each of the clamping arms has a wire-penetrating portion formed on a free end thereof.

10. The conductive terminal of claim 1, wherein the conductive terminal is formed of a single conductive sheet.

11. The conductive terminal of claim 1, wherein the bottom wall is formed by extending a pair of opposing free ends of the third sidewall and the fourth sidewall away from the opening towards each other.

12. The conductive terminal of claim 1, wherein the bottom wall is discontinuous between the third sidewall and the fourth sidewall.

13. A connector assembly, comprising:
a circuit board having a pair of solder pads; and
a conductive terminal including a body having an opening through which the conductive wire is inserted and a passage communicating with the opening, the passage receiving the conductive wire and extending perpendicular to a surface of the circuit board, the body including:
a first sidewall;
a second sidewall opposite the first sidewall;
a third sidewall, the first sidewall and the second sidewall formed by bending a pair of opposite sides of the third sidewall in a direction perpendicular to the third sidewall;
a fourth sidewall opposite the third sidewall and formed by extending a side of the second sidewall away from the third sidewall and a side of the first sidewall away from the third sidewall towards each other;
a bottom wall formed by extending a free end of the third sidewall and an opposing free end of the fourth sidewall towards each other, the bottom wall being discontinuous between the third sidewall and the fourth sidewall and blocking a movement in an insertion direction of the conductor of the conductive wire when the conductor is inserted into the conductive terminal in the insertion direction;
a clamping portion having a pair of clamping arms, the pair of clamping arms extending from the opening towards the circuit board and obliquely towards each other so as to clamp the conductor of the conductive wire inserted through the opening; and
a solder portion having a pair of solder lugs, the pair of solder lugs extending perpendicular to a lengthwise direction of the passage and each having a front side or a back side soldered to solder pads.

14. The connector assembly of claim 13, wherein the circuit board has a through hole, the body extends through the through hole when a back side of each of the solder lugs is soldered onto the solder pads.

15. A conductive terminal electrically connecting a conductor of a conductive wire to a circuit board, comprising:
a body having:
a plurality of sidewalls defining an opening through which the conductive wire is inserted and a passage communicating with the opening, the passage receiving the conductive wire and extending perpendicular to a surface of the circuit board; and
a bottom wall formed by extending a free end of at least two of the plurality of sidewalls opposite the opening towards each other, the bottom wall being discontinuous between the at least two of the plurality of sidewalls and blocking a movement in an insertion direction of the conductor of the conductive wire when the conductor is inserted into the conductive terminal in the insertion direction;
a clamping portion having a pair of clamping arms, the pair of clamping arms extending from the opening towards the circuit board and obliquely towards each other so as to clamp the conductor of the conductive wire inserted through the opening; and
a solder portion having a pair of solder lugs, the pair of solder lugs extending perpendicular to a lengthwise direction of the passage and soldered to a pair of solder pads on the circuit board.

16. The conductive terminal of claim 15, wherein the plurality of sidewalls include a first sidewall and a second sidewall opposite to each other.

17. The conductive terminal of claim 16, wherein the clamping portion has a pair of clamping arms extending from the first sidewall and the second sidewall.

18. The conductive terminal of claim 17, wherein the plurality of sidewalls include a third sidewall and a fourth sidewall that are opposite to each other.

19. The conductive terminal of claim 18, wherein the bottom wall is formed by extending a pair of free ends of the third sidewall and the fourth sidewall away from the opening towards each other.

20. The conductive terminal of claim 15, wherein the plurality of sidewalls include a first sidewall, a second sidewall, a third sidewall and a fourth sidewall, the first sidewall and the second sidewall formed by bending a pair of opposite sides of the third sidewall in a direction perpendicular to the third sidewall, and the fourth sidewall formed by extending a side of the second sidewall away from the third sidewall and a side of the first sidewall away from the third sidewall towards each other.

* * * * *